United States Patent
Cha et al.

(10) Patent No.: US 11,183,650 B2
(45) Date of Patent: Nov. 23, 2021

(54) DISPLAY SUBSTRATE, METHOD OF MANUFACTURING THE SAME, AND DISPLAY DEVICE INCLUDING THE SAME

(71) Applicant: Samsung Display Co., Ltd., Yongin-si (KR)

(72) Inventors: Myounggeun Cha, Seoul (KR); Sanggun Choi, Suwon-si (KR); Meejae Kang, Suwon-si (KR); Sanggab Kim, Seoul (KR); Joon woo Bae, Hwaseong-si (KR); Thanh Tien Nguyen, Seoul (KR); Kyoungwon Lee, Seoul (KR); Yongsu Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/202,595

(22) Filed: Nov. 28, 2018

(65) Prior Publication Data
US 2019/0181360 A1    Jun. 13, 2019

(30) Foreign Application Priority Data

Dec. 12, 2017    (KR) .......................... 10-2017-0170610

(51) Int. Cl.
| | |
|---|---|
| *H01L 51/00* | (2006.01) |
| *H01L 27/32* | (2006.01) |
| *H01L 51/52* | (2006.01) |
| *H01L 51/50* | (2006.01) |
| *H01L 51/56* | (2006.01) |

(52) U.S. Cl.
CPC ...... *H01L 51/0096* (2013.01); *H01L 27/3246* (2013.01); *H01L 27/3258* (2013.01); *H01L 27/3265* (2013.01); *H01L 27/3276* (2013.01); *H01L 51/0023* (2013.01); *H01L 51/5012* (2013.01); *H01L 51/5206* (2013.01); *H01L 51/5221* (2013.01); *H01L 51/56* (2013.01); *H01L 51/5253* (2013.01)

(58) Field of Classification Search
None
See application file for complete search history.

(56) References Cited

U.S. PATENT DOCUMENTS 9,196,665 B2    11/2015    Chae
2002/0098679 A1*    7/2002    Schwarzl .......... H01L 21/76807
                                                                              438/625

(Continued)

FOREIGN PATENT DOCUMENTS

| JP | 5497279 B2 | 3/2014 |
|---|---|---|
| KR | 10-2016-0086526 A | 7/2016 |

*Primary Examiner* — Zandra V Smith
*Assistant Examiner* — Lawrence C Tynes, Jr.
(74) *Attorney, Agent, or Firm* — Kile Park Reed & Houtteman PLLC

(57) ABSTRACT

A display substrate includes a first conductive layer on a base substrate, a first insulation layer on the first conductive layer, a second conductive layer on the first insulation layer, a second insulation layer on the second conductive layer, and a third conductive layer on the second insulation layer. The third conductive layer is connected to the first conductive layer and the second conductive layer through a contact hole passing through the first insulation layer, the second conductive layer, and the second insulation layer. A sidewall of the contact hole has a stepped shape.

7 Claims, 10 Drawing Sheets

(56) References Cited

U.S. PATENT DOCUMENTS

| | | | |
|---|---|---|---|
| 2015/0076501 A1* | 3/2015 | Hayashi | G02F 1/1368 257/72 |
| 2016/0056225 A1* | 2/2016 | Lee | H01L 51/0023 257/40 |
| 2016/0351546 A1* | 12/2016 | Tsai | H01L 21/76877 |
| 2019/0148072 A1* | 5/2019 | Fox, III | H01L 28/92 361/301.4 |

* cited by examiner

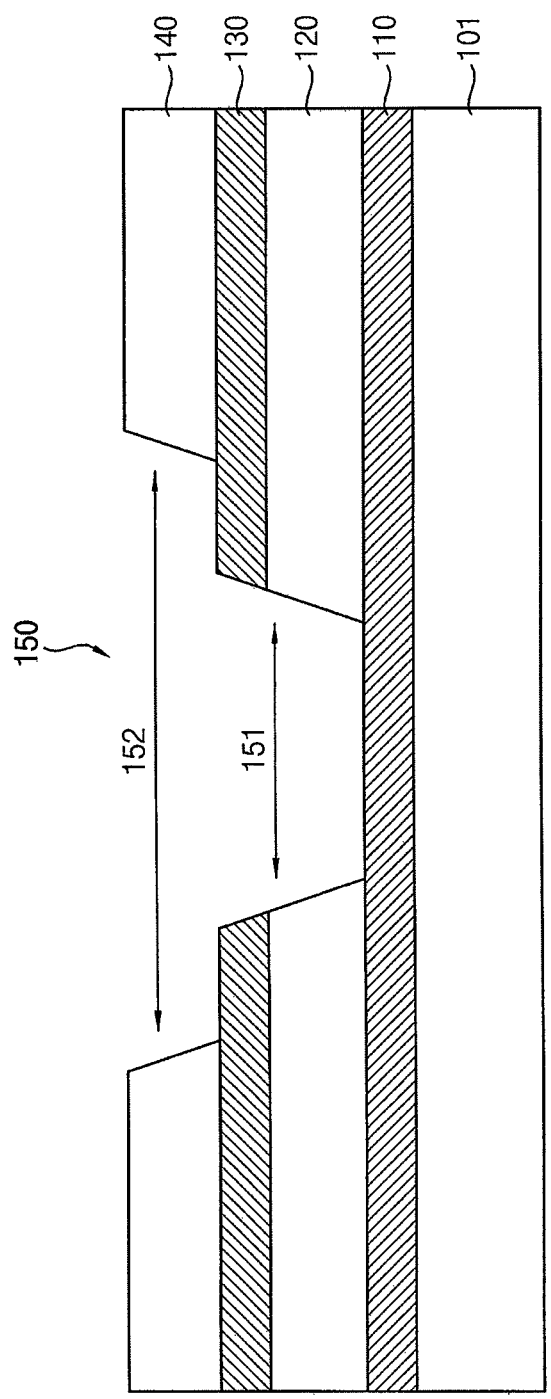

DISPLAY SUBSTRATE, METHOD OF MANUFACTURING THE SAME, AND DISPLAY DEVICE INCLUDING THE SAME

CROSS-REFERENCE TO RELATED APPLICATION

Korean Patent Application No. 10-2017-0170610, filed on Dec. 12, 2017, and entitled, "Display Substrate, Method of Manufacturing the Same, and Display Device Including the Same," is incorporated by reference herein in its entirety.

BACKGROUND

1. Field

One or more embodiments described herein relate to a display substrate, a method for manufacturing a display substrate, and a display device.

2. Description of the Related Art

A variety of displays have been developed. Examples include liquid crystal displays, electrophoresis displays, organic light-emitting displays, field emission displays, and plasma displays. These displays form images based on light from a plurality of pixels. The pixels may output red, green, blue, white, or another color of light. Wiring or other conductors may be used to transmit signals to the light emitting elements and/or pixel circuits of the pixels. The conductors may include a stacked arrangement of conductive layers, with insulation layers therebetween. The conductive layers may be connected to each other through a contact hole in the insulation layers.

SUMMARY

In accordance with one or more embodiments, a display substrate includes a base substrate; a first conductive layer on the base substrate; a first insulation layer on the first conductive layer; a second conductive layer on the first insulation layer; a second insulation layer on the second conductive layer; and a third conductive layer on the second insulation layer and connected to the first conductive layer and the second conductive layer through a contact hole passing through the first insulation layer, the second conductive layer, and the second insulation layer, wherein a sidewall of the contact hole has a stepped shape. The contact hole may include a first part passing through the first insulation layer and the second conductive layer; and a second part passing through the second insulation layer and having a width greater than a width of the first part. The first part and the second part may overlap with each other. The third conductive layer may contact a side surface and a portion of an upper surface of the second conductive layer.

In accordance with one or more other embodiments, a method for manufacturing a display substrate includes sequentially stacking a first conductive layer, a first insulation layer, a second conductive layer, and a second insulation layer on a base substrate; forming a contact hole passing through the first insulation layer, the second conductive layer, and the second insulation layer, a sidewall of the contact hole having a stepped shape; and forming a third conductive layer connected to the first and second conductive layers through the contact hole on the second insulation layer.

Forming the contact hole may include etching a first part of the second insulation layer; etching the second conductive layer; etching a second part of the second insulation layer; and etching the first insulation layer. Forming the contact hole may include forming a photoresist layer on the second insulation layer; and removing a portion of the photoresist layer corresponding to the first part of the second insulation layer to form a photoresist pattern. The first part of the second insulation layer may be etched using the photoresist pattern as an etch stopper. The second conductive layer may be etched using the second insulation layer as an etch stopper.

Forming the contact hole may include performing an etchback of a portion of the photoresist pattern corresponding to the second part of the second insulation layer. Etching the second part of the second insulation layer may include etching the second insulation layer using the etched photoresist pattern as an etch stopper. Etching the second conductive layer and performing the etchback of the portion of the photoresist pattern may be simultaneously performed. Etching the first insulation layer may include etching the first insulation layer using the second conductive layer as an etch stopper. Etching the second part of the second insulation layer and etching the first insulation layer may be simultaneously performed.

In accordance with one or more other embodiments, a display device includes a switching element including a semiconductor layer, a gate insulation layer, a gate electrode, a first insulation layer, a second insulation layer, a source electrode, and a drain electrode, the source electrode and drain electrode connected to the semiconductor layer by passing through the gate insulation layer, the first insulation layer, and the second insulation layer, which are sequentially disposed on a base substrate; a light emitting element electrically connected to the switching element; a first conductive layer on the gate insulation layer; a second conductive layer on the first insulation layer; a third conductive layer on the second insulation layer, the third conductive layer connected to the first conductive layer and the second conductive layer through a contact hole passing through the first insulation layer, the second conductive layer, and the second insulation layer, wherein a sidewall of the contact hole has a stepped shape.

The contact hole may include a first part passing through the first insulation layer and the second conductive layer; and a second part passing through the second insulation layer having a width greater than a width of the first part. The first part and the second part may overlap with each other. The third conductive layer may contact a side surface and a portion of an upper surface of the second conductive layer.

The display device may include a lower electrode on the gate insulation layer and an upper electrode on the first insulation layer, the upper electrode overlapped with the lower electrode, wherein the lower electrode, the first insulation layer, and the upper electrode correspond to a capacitor. The light emitting element may include a first electrode electrically connected to the drain electrode, an organic light emitting layer on the first electrode, and a second electrode on the organic light emitting layer.

BRIEF DESCRIPTION OF THE DRAWINGS

Features will become apparent to those of skill in the art by describing in detail exemplary embodiments with reference to the attached drawings in which:

FIGS. 2A-2H illustrate various cross-sectional stages of an embodiment of a method for manufacturing a display substrate.

DETAILED DESCRIPTION

Figure 1:
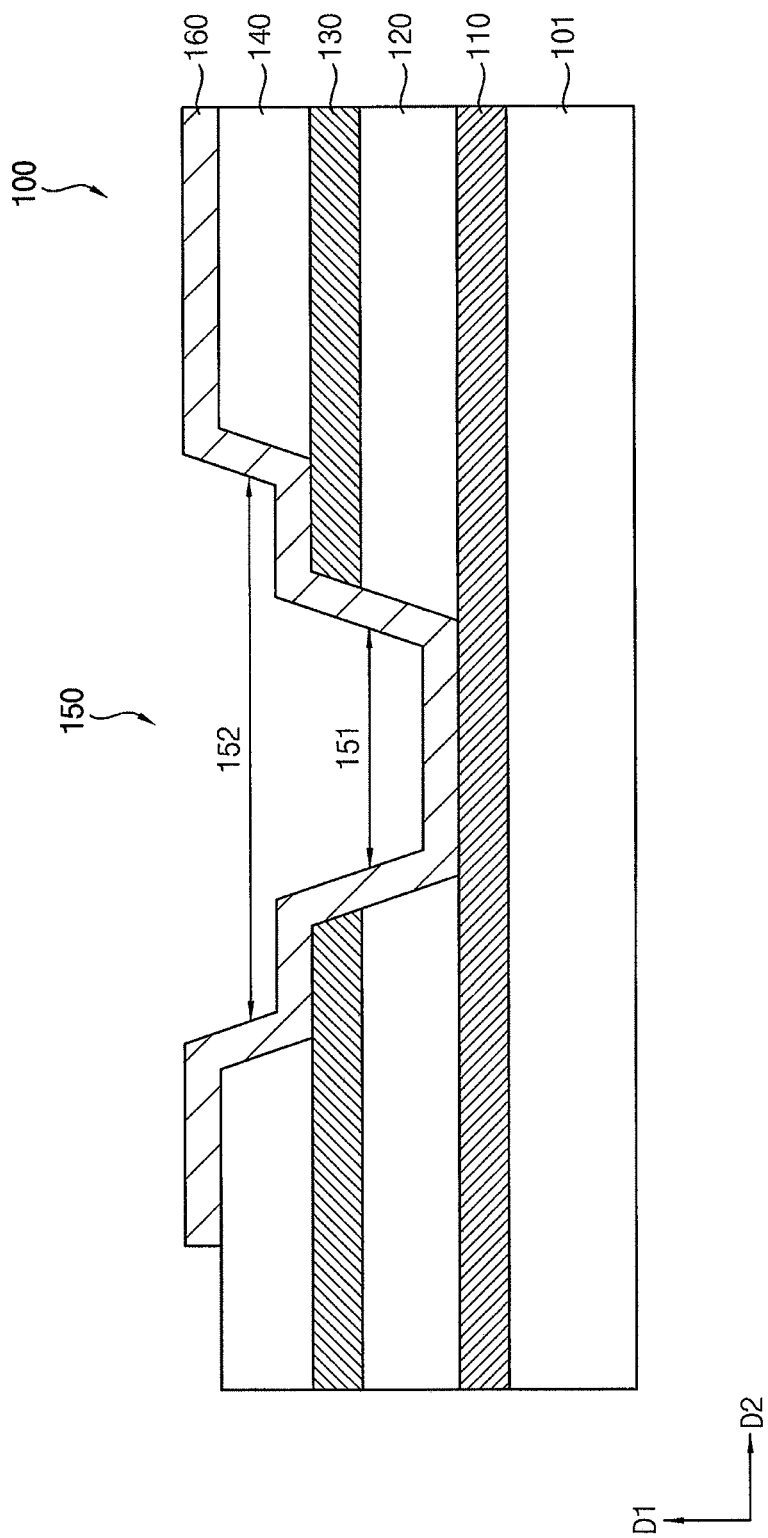
FIG. 1 illustrates an embodiment of a display substrate.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a cross-sectional embodiment of a display substrate 100 which may include a base substrate 101, a first conductive layer 110, a first insulation layer 120, a second conductive layer 130, a second insulation layer 140, and a third conductive layer 160 stacked along a first direction D1.

The first conductive layer 110 may be on the base substrate 101. The first conductive layer 110 may be directly on the base substrate 101 or may be on the base substrate 101 with one or more insulation layers in between. The first insulation layer 120 may be on the first conductive layer 110. The second conductive layer 130 may be on the first insulation layer 120. The second insulation layer 140 may be on the second conductive layer 130.

The first conductive layer 110 and the second conductive layer 130 may include a conductive material, e.g., a metal, a mixture thereof, a nitride thereof, a conductive oxide material, or another material. Examples of the metal include aluminum (Al), silver (Ag), tungsten (W), copper (Cu), nickel (Ni), chrome (Ch), molybdenum (Mo), titanium (Ti), platinum (Pt), tantalum (Ta), neodymium (Nd), and scandium (Sc). Examples of the conductive oxide material include indium tin oxide (ITO), indium zinc oxide (IZO), and aluminum doped zinc oxide (AZO). The first conductive layer 110 and the second conductive layer 130 may have a single-layered structure or a multi-layered structure.

The first insulation layer 120 and the second insulation layer 140 may include an insulation material, e.g., an inorganic insulation material or an organic insulation material. Examples of the first insulation layer 120 and the second insulation layer 140 include silicon nitride (SiNx), silicon oxide (SiOx), and silicon oxynitride (SiOxNy). The first insulation layer 120 and the second insulation layer 140 may have a single-layered structure or a multi-layered structure.

A contact hole 150 may be formed to pass through the first insulation layer 120, the second conductive layer 130, and the second insulation layer 140 along the first direction D1. The contact hole 150 may have a lower surface and a sidewall. The lower surface of the contact hole 150 may expose a portion of an upper surface (extending along a second direction D2) of the first conductive layer 110. The sidewall of the contact hole 150 may expose a lateral portion of the first insulation layer 120, a lateral portion of the second conductive layer 130, and a lateral portion of the second insulation layer 140. The contact hole 150 exposes a portion of an upper surface of the second conductive layer 130, e.g., extending on either side of the contact hole 150 extending along the second direction D2.

The sidewall of the contact hole 150 may have a stepped shape. In an embodiment, the sidewall of the contact hole 150 may expose a side surface of the first insulation layer 120, a side surface and a portion of an upper surface of the second conductive layer 130, and a side surface of the second insulation layer 140.

The contact hole 150 may include a first part 151 passing through the first insulation layer 120 and the second insulation layer 130 along the first direction D1, and a second part 152 passing through the second insulation layer 140 along the first direction D1. The first part 151 of the contact hole 150 may expose a portion of the upper surface of the first conductive layer 110, the side surface of the first insulation layer 120, and the side surface of the second conductive layer 130. The second part 152 of the contact hole 150 may expose a portion of the upper surface of the second conductive layer 130 and the side surface of the second insulation layer 140. A width of the second part 152 of the contact hole 150 may be greater than a width of the first part 151 of the contact hole 150 along the second direction D2. Thus, a sidewall of the contact hole 150 may have a stepped shape. The exposed side surface may be oriented at an angle (e.g., an oblique angle) with respect to the first direction D1 and the second direction D2.

The first part 151 and the second part 152 of the contact hole 150 may overlap each other along the first direction D1. In an embodiment, a portion (e.g., a center portion) of the second part 152 of the contact hole 150 may overlap an entirety of the first part 151 of the contact hole 150 along the first direction D1.

The third conductive layer 160 may be on the second insulation layer 140 and may include a conductive material, e.g., a metal, a mixture thereof, a nitride thereof, or a conductive oxide material. Examples of the metal include Al, Ag, W, Cu, Ni, Ch, Mo, Ti, Pt, Ta, Nd, and Sc. Examples of the conductive oxide material include ITO, IZO, and AZO. The third conductive layer 160 may have a single-layered structure or a multi-layered structure.

The third conductive layer 160 may be connected to the first conductive layer 110 and the second conductive layer 130 through the contact hole 150. The third conductive layer 160 may be in contact with a portion of the upper surface of the first conductive layer 110 exposed by the first part 151 of the contact hole 150. The third conductive layer 160 may be in contact with the side surface of the second conductive layer 130 exposed by the first part 151 of the contact hole 150 and the portion of the upper surface of the second conductive layer 130 exposed by the second part 152 of the contact hole 150.

The third conductive layer 160 may be formed along a profile of the sidewall of the contact hole 150 having a stepped shape. Accordingly, the third conductive layer 160 may have a stepped shape. Because the third conductive layer 160 is in contact with the portion of the upper surface, as well as the side surface of the second conductive layer 130, while having the stepped shape, disconnection of the third conductive layer 160 may be prevented.

The third conductive layer 160 may be in contact with the first conductive layer 110 and the second conductive layer 130 through the contact hole 150, which exposes the portion of the first conductive layer 110 and the portion of the second conductive layer 130. Thus, the first conductive layer 110, the second conductive layer 130, and the third conductive layer 160 may be electrically connected to each other. Accordingly, the first conductive layer 110, the second conductive layer 130, and the third conductive layer 160 may constitute a conductive body.

In an embodiment, the first conductive layer 110 and the second conductive layer 130 may be electrodes of an element in the display substrate 100. The third conductive layer 160 may be a wiring in the display substrate 100. The element and the wiring in the display substrate 100 may be electrically connected by formation of the conductive body.

FIGS. 2A-2H are cross-sectional views of various stages of an embodiment of a method for manufacturing a display substrate, which, for example, may be the display substrate 100 of FIG. 1.

Figure 2A:
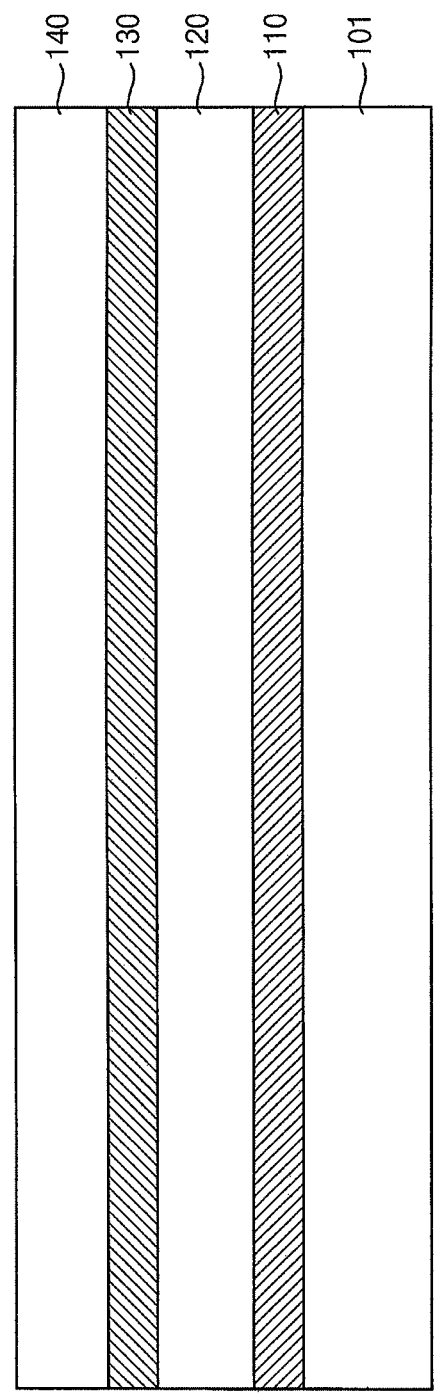
Figure 2B:
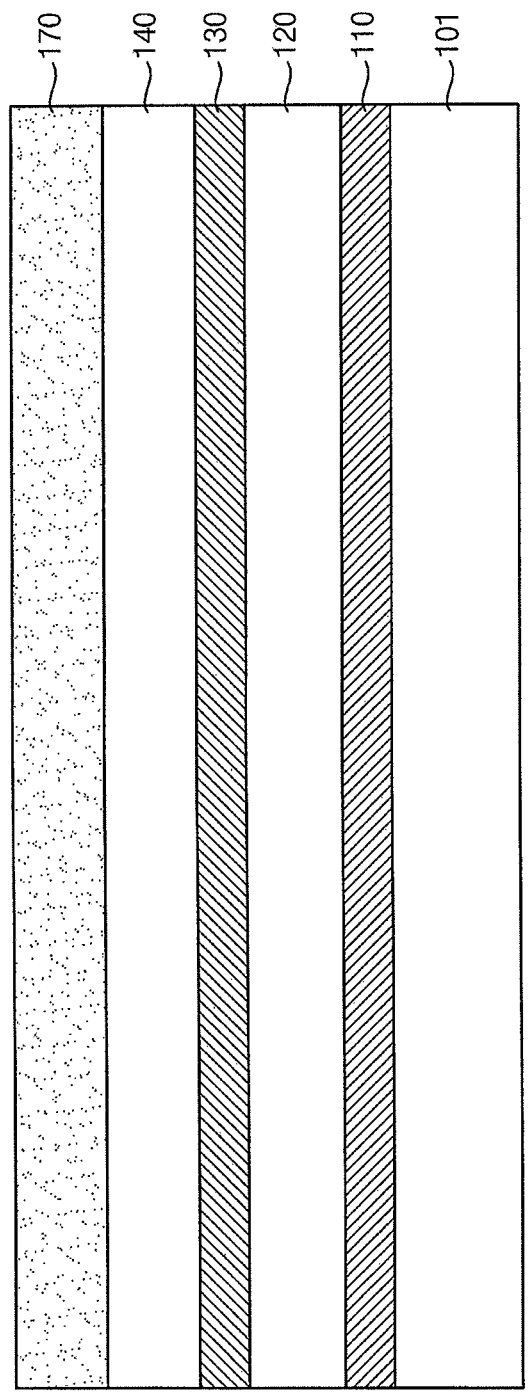
Figure 2C:
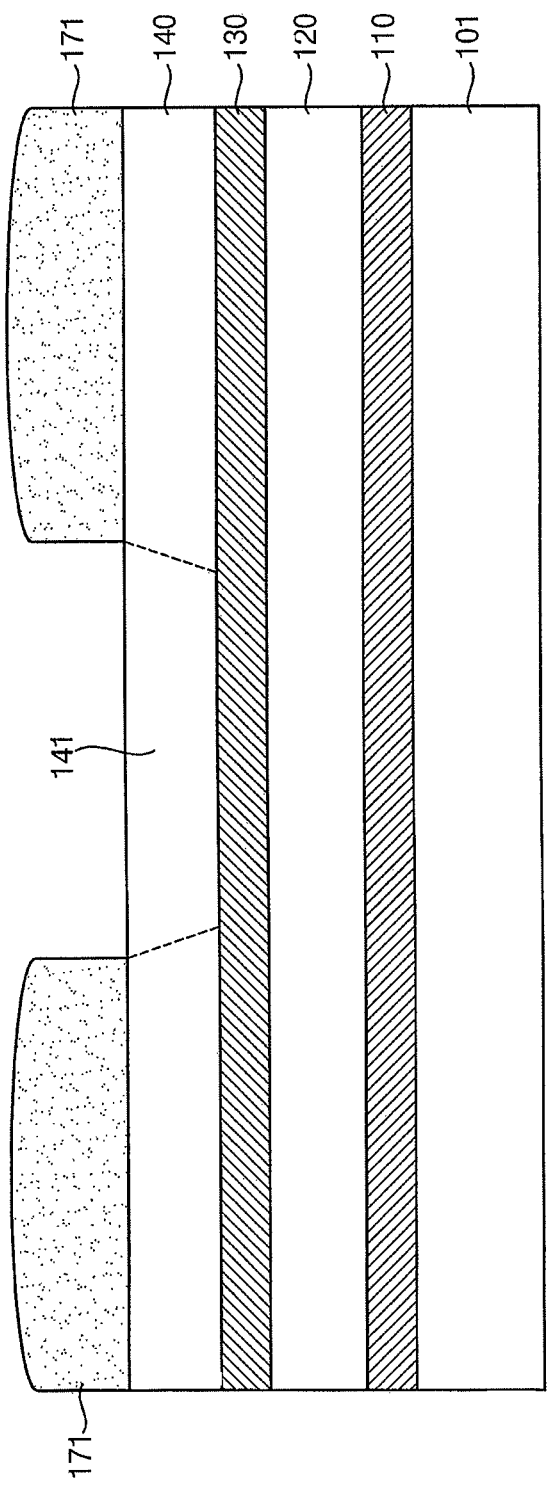
Figure 2D:
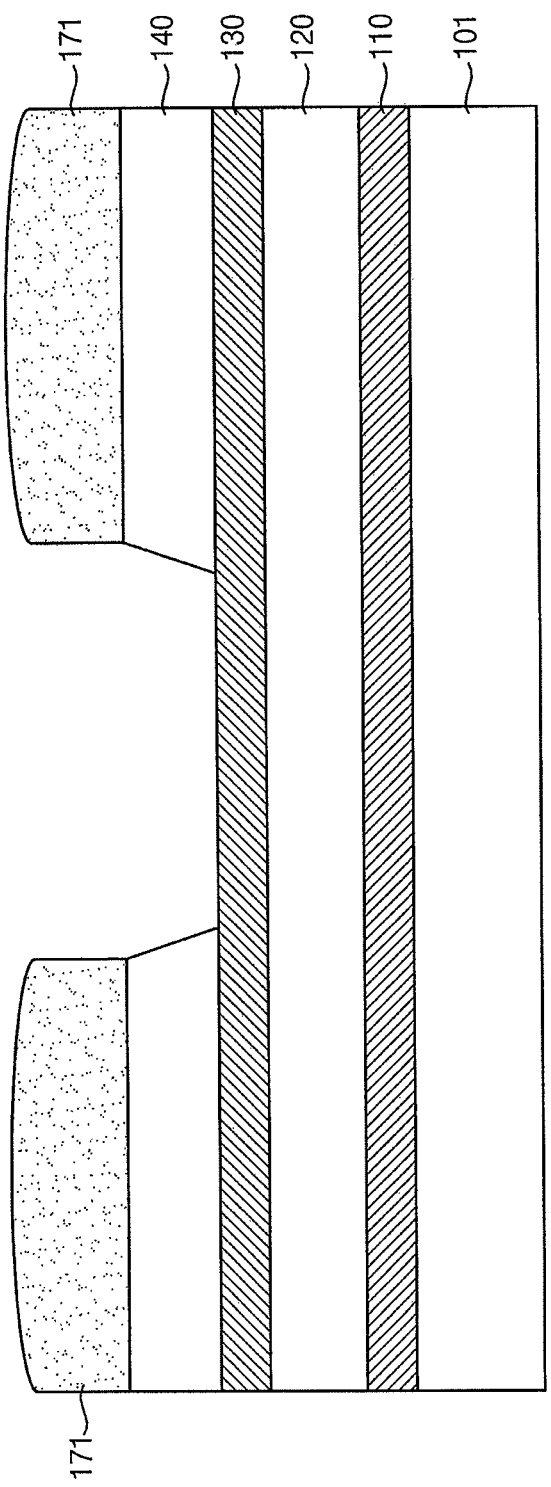
Figure 2E:
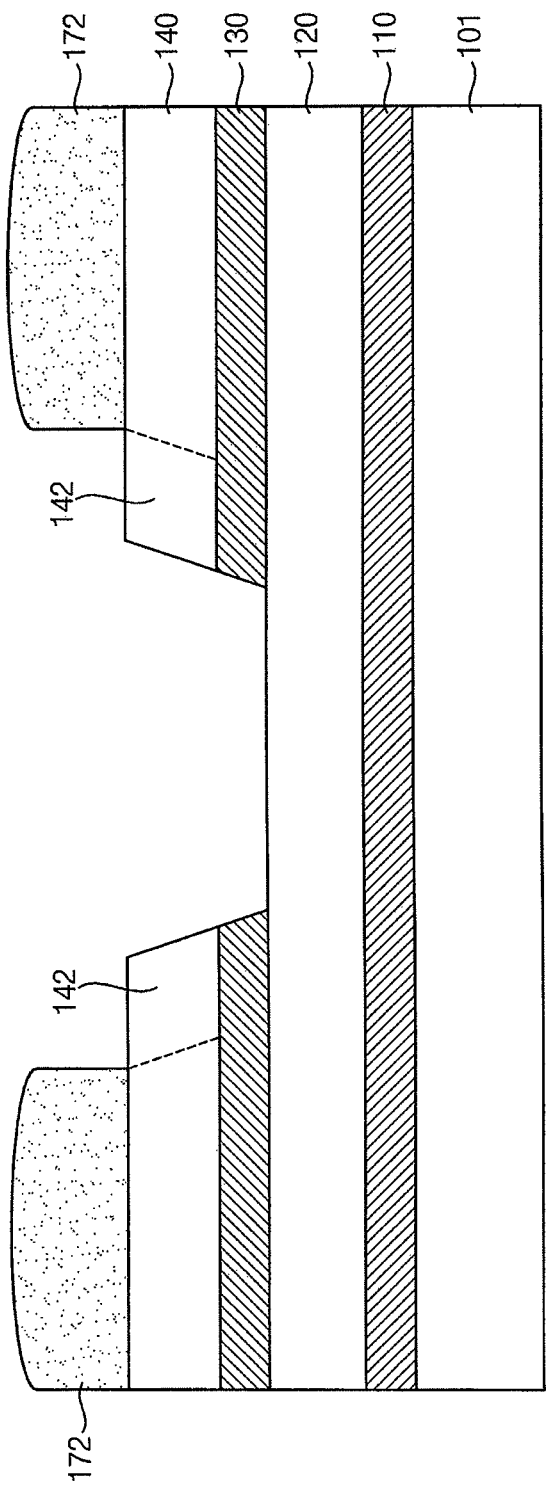
Figure 2F:
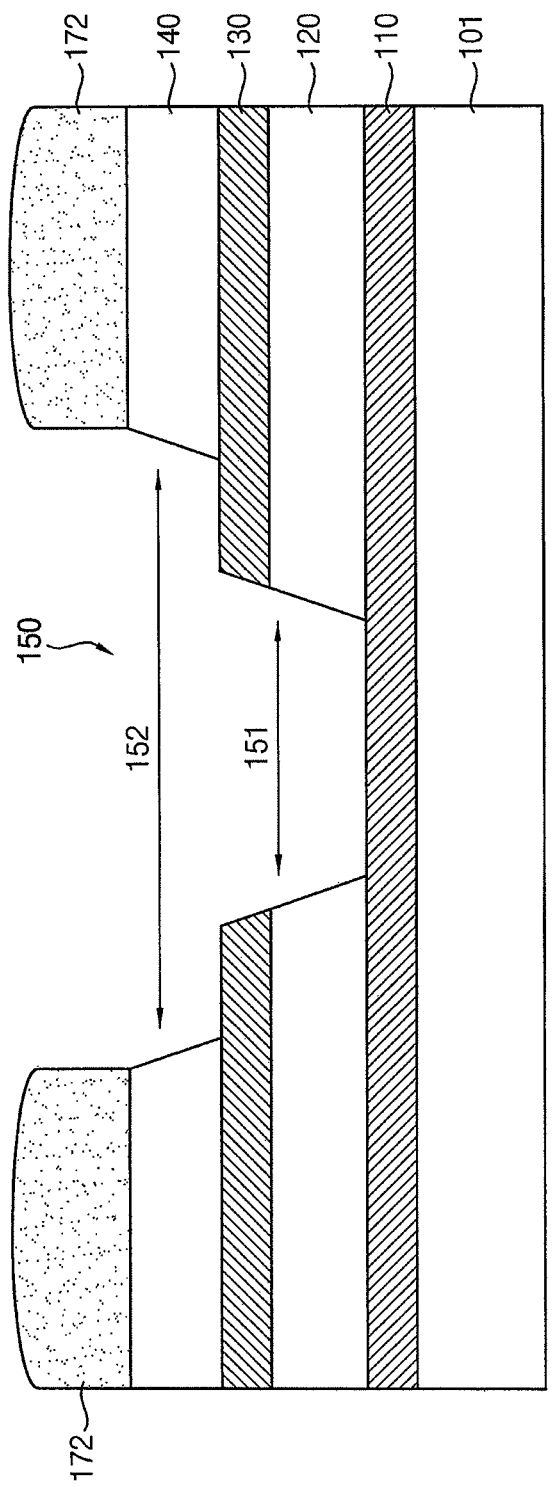

Referring to FIG. 2A, the method includes sequentially stacking the first conductive layer 110, the first insulation layer 120, the second conductive layer 130, and the second insulation layer 140 on the base substrate 101. The first conductive layer 110 may be formed on the base substrate 101. The first insulation layer 120 may be formed on the first conductive layer 110. The second conductive layer 130 may be formed on the first insulation layer 120. The second insulation layer 140 may be formed on the second conductive layer 130.

The first conductive layer 110 and the second conductive layer 130 may be formed of a conductive material (e.g., a metal, a mixture thereof, a nitride thereof, or a conductive oxide material), for example, by a sputtering, a chemical vapor deposition, or another process. The first insulation layer 120 and the second insulation layer 140 may be formed of an insulation material (e.g., an inorganic insulation material, an organic insulation material, or another material), for example, by a sputtering, a chemical vapor deposition, or another process.

Referring to FIGS. 2B, 2C, 2D, 2E, 2F, and 2G, the contact hole 150 may be formed to pass through the first insulation layer 120, the second conductive layer 130, and the second insulation layer 140. The sidewall of the contact hole 150 may have a stepped shape.

First, a photoresist layer 170 may be formed on the second insulation layer 140. Then, the photoresist layer 170 may be partially etched to form a photoresist pattern 171. The photoresist pattern 171 may be formed, for example, by removing a portion of the photoresist layer 170 corresponding to a first part 141 of the second insulation layer 140.

In an embodiment, a photomask may be formed over the photoresist layer 170, and an exposure process may irradiate light from top of the photomask toward the photoresist layer 170.

The photomask may have areas with different light transmittances. In an example, when the photoresist layer 170 is formed of a positive photoresist, a light transmittance of an area of the photomask corresponding to the first part 141 of the second insulation layer 140 may be about 100% and a light transmittance of the other area of the photomask may be about 0%. In another example, when the photoresist layer 170 is formed of a negative photoresist, a light transmittance of an area of the photomask corresponding to the first part 141 of the second insulation layer 140 may be about 0%, and a light transmittance of the other area of the photomask may be about 100%. A development process may be performed after the exposure process to form the photoresist pattern 171.

Then, the first part 141 of the second insulation layer 140 may be etched, for example, by a dry etching process. The photoresist pattern 171 may be used as an etch stopper to etch the first part 141 of the second insulation layer 140, which is not covered by the photoresist pattern 171.

Then, the second conductive layer 130 may be etched, for example, by a dry etching process. The second insulation layer 140 may be used as an etch stopper to etch a portion of the second conductive layer 130, which is not covered by the second insulation layer 140.

Further, etchback process may be performed to etch the photoresist pattern 171. A portion of the photoresist pattern 171 corresponding to a second part 142 of the second insulation layer 140 may be etched by the etchback process to form the photoresist pattern 172, having a decreased width. The second part 142 of the second insulation layer 140 may be a part adjacent to the etched first part 141. The thickness and width of the etched photoresist pattern 172 may be decreased in comparison with the photoresist pattern 171 before the etchback process.

In an embodiment, etching the second conductive layer 130 and the etchback process for etching the photoresist pattern 171 may be substantially simultaneously performed. For example, the second conductive layer 130 may be etched by inputting an etching gas for a dry etching, and then the etchback process for etching the photoresist pattern 171 may be performed by substituting the etching gas by a gas for the etchback process. Therefore, the second conductive layer 130 and the photoresist pattern 171 may be etched in the same process.

Then, the first insulation layer 120 may be etched, for example, by a dry etching process. The second conductive layer 130 may be used as an etch stopper to etch a portion of the first insulation layer 120 which is not covered by the second conductive layer 130.

Further, the second part 142 of the second insulation layer 140 may be etched, for example, by a dry etching process. The etched photoresist pattern 172 may be used as an etch stopper to etch the second part 142 of the second insulation layer 140 which is not covered by the photoresist pattern 172. In an embodiment, etching the first insulation layer 120 and etching the second part 142 of the second insulation layer 140 may be substantially simultaneously performed. Then, the etched photoresist pattern 172 may be removed, for example, by ashing or another process.

As described above, the first part 141 of the second insulation layer 140, the second conductive layer 130, the second part 142 of the second insulation layer 140, and the first insulation layer 120 may be sequentially etched. As a result, the contact hole 150 may be formed to pass through the first insulation layer 120, the second conductive layer 130, and the second insulation layer 140.

Figure 2H:
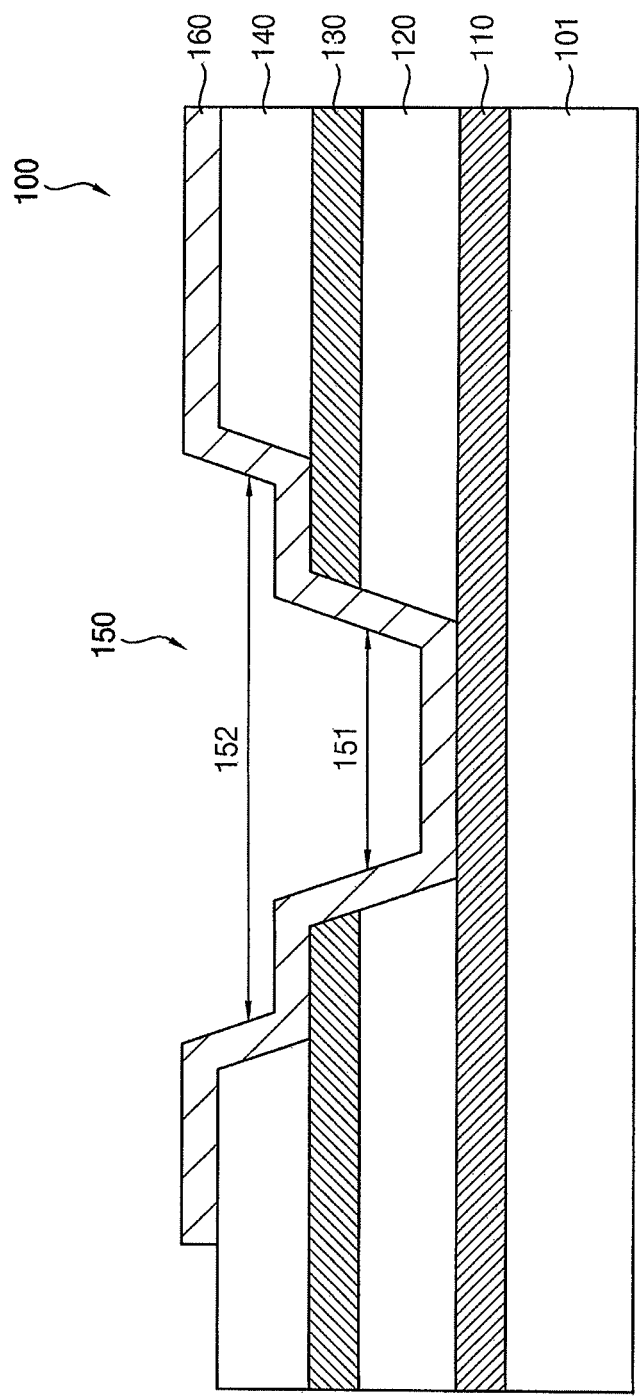

Referring to FIG. 2H, the third conductive layer 160 may be formed on the second insulation layer 140. The third conductive layer 160 may be formed to be connected to, or in contact with, the first conductive layer 110 and the second conductive layer 130 through the contact hole 150.

The third conductive layer 160 may be formed of a conductive material (e.g., a metal, a mixture thereof, a nitride thereof, or a conductive oxide material), for example, by a sputtering, a chemical vapor deposition, or another process. The third conductive layer 160 may be formed inside the contact hole 150 along a profile of the contact hole 150, having a sidewall with a stepped shape.

A single photolithography process including an exposure process and a development process may be performed to form the contact hole 150 by performing the etchback process. Accordingly, manufacturing costs, manufacturing time, and manufacturing inefficiencies for forming the display substrate 100 may be reduced.

Figure 3:
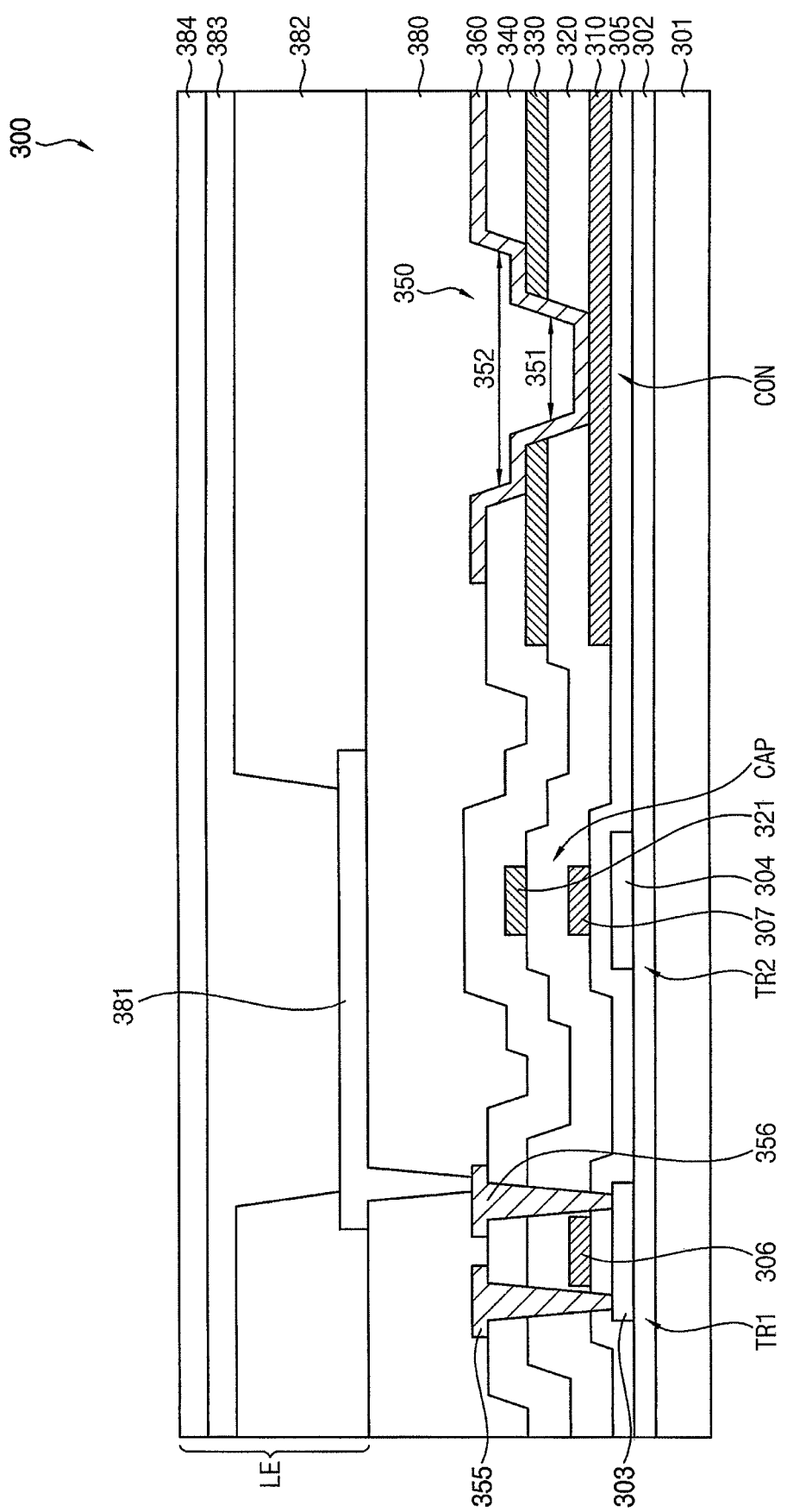
FIG. 3 illustrates an embodiment of a display device.

FIG. 3 illustrates a cross-sectional embodiment of a display device 300 which may include a switching element including a first thin film transistor TR1 on a base substrate 301, a second thin film transistor TR2, a capacitor CAP, a conductive body CON, and a light emitting element LE.

The base substrate 301 may include a transparent insulating substrate. A glass substrate, a transparent plastic substrate formed of polyethylene terephthalate (PET), polyethylene naphthalate (PEN), polyimide (PI), etc., or a transparent metal oxide substrate may be used as the base substrate 301.

A buffer layer 302 may be on the base substrate 301. The buffer layer 302 may prevent impurities from permeating into or through the base substrate 301 and may improve a flatness over the base substrate 301. Stress generated during formation of a gate electrode 306 may be reduced when the buffer layer 302 is on the base substrate 301. The buffer layer 302 may include an inorganic insulation material, e.g., silicon nitride (SiNx), silicon oxide (SiOx), or silicon oxynitride (SiOxNy).

A first semiconductor layer 303 and a second semiconductor layer 304 may be on the buffer layer 302. The first semiconductor layer 303 and the second semiconductor layer 304 may include amorphous silicon or polycrystalline silicon. Each of the first semiconductor layer 303 and the second semiconductor layer 304 may include impurity areas doped by p-type or n-type impurities at opposite ends thereof. A channel area may be between the impurity areas.

In an embodiment, the first semiconductor layer 303 and the second semiconductor layer 304 may include an oxide semiconductor. In this case, the impurities areas may be omitted. The oxide semiconductor may include, for example, indium gallium zinc oxide (IGZO), zinc tin oxide (ZTO), or indium tin zinc oxide (ITZO).

A gate insulation layer 305 may cover the first semiconductor layer 303 and the second semiconductor layer 304 and may be on the buffer layer 302. The gate insulation layer 305 may include an inorganic insulation material, e.g., silicon oxide, silicon nitride, silicon oxynitride, or an organic insulation material. For example, the gate insulation layer 305 may have a multi-layered structure including a silicon oxide layer and a silicon oxynitride layer.

The gate electrode 306, a lower electrode 307, and a first conductive layer 310 may be on the gate insulation layer 305. The gate electrode 306 may overlap the channel area of the first semiconductor layer 303. The lower electrode 307 may overlap the channel area of the second semiconductor layer 304. The gate electrode 306, the lower electrode 307, and the first conductive layer 310 may include a conductive material, e.g., a metal, a mixture thereof, a nitride thereof, or a conductive oxide material. In an embodiment, the gate electrode 306, the lower electrode 307, and the first conductive layer 310 may include substantially the same material.

The first thin film transistor TR1 may be defined by the first semiconductor layer 303, the gate insulation layer 305, and the gate electrode 306. The second thin film transistor TR2 may be defined by the second semiconductor layer 304, the gate insulation layer 305, and the lower electrode 307. In this case, the lower electrode 307 may be provided as a gate electrode of the second thin film transistor TR2.

A first insulation layer 320 covering the gate electrode 306, the lower electrode 370, and the first conductive layer 310 may be on the gate insulation layer 305. The first insulation layer 320 may include an inorganic insulation material, e.g., silicon oxide, silicon nitride, silicon oxynitride, or organic insulation material. The first insulation layer 320 may have a single-layered structure or a multi-layered structure.

An upper electrode 321 and a second conductive layer 330 may be on the first insulation layer 320. The upper electrode 321 may overlap the lower electrode 307. The upper electrode 321 and the second conductive layer 330 may include a conductive material, e.g., a metal, a mixture thereof, a nitride thereof, or a conductive oxide material. In an embodiment, the upper electrode 321 and the second conductive layer 330 may include substantially the same material.

The capacitor CAP may be defined by the lower electrode 307, the first insulation layer 320, and the upper electrode 321. Accordingly, the display device 300 may have a structure including two thin film transistors and one capacitor in each pixel. The number of thin film transistors and/or capacitors in each pixel may be different in another embodiment. For example, the display device 300 may include three or more thin film transistors and two or more transistors in each pixel.

A second insulation layer 340 covering the upper electrode 321 and the second conductive layer 330 may be on the first insulation layer 320. The second insulation layer 340 may include an inorganic insulation material, e.g., silicon oxide, silicon nitride or silicon oxynitride, or an organic insulation material. The second insulation layer 340 may have a single-layered structure or a multi-layered structure.

A source electrode 355, a drain electrode 356, and a third conductive layer 360 may be on the second insulation layer 340. The source electrode 355 and the drain electrode 356 may be respectively connected to the impurity areas of the first semiconductor layer 303 by passing through the gate insulation layer 305, the first insulation layer 320, and the second insulation layer 340.

The third conductive layer 360 may be connected to the first conductive layer 310 and the second conductive layer 330 through a contact hole 350. The contact hole 350 may pass through the first insulation layer 320, the second conductive layer 330, and the second insulation layer 340. The contact hole 350 may have a lower surface and a sidewall. The lower surface of the contact hole 350 may expose an upper portion of the first conductive layer 310. The sidewall of the contact hole 350 may expose a lateral portion of the first insulation layer 320, a lateral portion of the second conductive layer 330, and a lateral portion of the second insulation layer 340.

The sidewall of the contact hole 350 may have a stepped shape. In an embodiment, the sidewall of the contact hole 350 may expose a side surface of the first insulation layer 320, a side surface and an upper surface of the second conductive layer 330, and a side surface of the second insulation layer 340.

The contact hole 350 may include a first part 351 passing through the first insulation layer 320 and the second insulation layer 330, and a second part 352 passing through the second insulation layer 340. The first part 351 of the contact hole 350 may expose the upper surface of the first conductive layer 310, the side surface of the first insulation layer 320, and the side surface of the second conductive layer 330. The second part 352 of the contact hole 350 may expose the upper surface of the second conductive layer 330 and the side surface of the second insulation layer 340. A width of the second part 352 of the contact hole 350 may be greater than a width of the first part 351 of the contact hole 350.

The first part 351 and the second part 352 of the contact hole 350 may overlap with each other. In an embodiment, a portion (e.g., a center portion) of the second part 352 of the contact hole 350 may overlap an entirety of the first part 351 of the contact hole 350.

The third conductive layer 360 may be in contact with a portion of the upper surface of the first conductive layer 310 exposed by the first part 351 of the contact hole 350. The third conductive layer 360 may be in contact with the side surface of the second conductive layer 330 exposed by the first part 351 of the contact hole 350 and a portion of the upper surface of the second conductive layer 330 exposed by the second part 352 of the contact hole 350.

The source electrode 355, the drain electrode 356, and the third conductive layer 360 may include a conductive material. e.g., a metal, a mixture thereof, a nitride thereof, or a conductive oxide material. In an embodiment, the source electrode 355, the drain electrode 356, and the third conductive layer 360 may include substantially the same material.

The switching element may be defined by the first semiconductor layer 303, the gate insulation layer 305, the gate electrode 306, the source electrode 355, and the drain electrode 356. The third conductive layer 360 may be in contact with the first conductive layer 310 and the second conductive layer 330 through the contact hole 350 exposing a portion of the first conductive layer 310 and a portion of the second conductive layer 330, so that the first conductive layer 310, the second conductive layer 330, and the third conductive layer 360 may be electrically connected to each other. Accordingly, the conductive body CON may be defined by the first conductive layer 310, the second conductive layer 330, and the third conductive layer 360.

In an embodiment, the first conductive layer 310 and the second conductive layer 330 may be electrodes of an element in the display device 300. The third conductive layer 360 may be a wiring in the display device 300. The element and the wiring in the display device 300 may be electrically connected by formation of the conductive body CON.

A planarization layer 380 covering the source electrode 355, the drain electrode 356, and the third conductive layer 360 may be on the second insulation layer 340. The planarization layer 380, for example, may include an organic insulation material having transparent property. Examples include an acryl-based resin, a polyimide-based resin, a siloxane-based resin, or benzocyclobutene (BCB).

The light emitting element LE electrically connected to the switching element may be on the planarization layer 380. The light emitting element LE may include a first electrode 381, a pixel defining layer 382, an organic light emitting layer 383, and a second electrode 384. The first electrode 381 may be electrically connected to the drain electrode 356 through the planarization layer 380. The first electrode 381 may include, for example, a transparent conductive material such as ITO, ZTO, IZO, zinc oxide or tin oxide, a metal such as Cr, Al, Ta, Mo, Ti, W, Cu, Ag or Nd, or an alloy of these metals. The first electrode 381 may serve as a pixel electrode and/or an anode of the display device 300.

The pixel defining layer 382 may be on the planarization layer 380 to cover a peripheral portion of the first electrode 381. The pixel defining layer 382 may define a pixel region of the display device 300. A portion of the first electrode 381 not covered by the pixel defining layer 382 may substantially correspond to an area of the pixel region. The pixel defining layer 382 may include, for example, a photosensitive material such as polyimide resin or acryl resin. In one embodiment, the pixel defining layer 382 may include a non-photosensitive organic material or an inorganic material.

The organic light emitting layer 383 may be on the pixel defining layer 382 and the first electrode 381 exposed by the pixel defining layer 382. In an embodiment, a hole transport layer (HTL) may be further included between the first electrode 381 and the organic light emitting layer 383.

The organic light emitting layer 383 may include at least one of light emitting materials for generating different colors of light, e.g., red, green, or blue, or another color. In an embodiment, the organic light emitting layer 383 may include a mixture of the light emitting materials for generating a white light.

As illustrated in FIG. 3, the organic light emitting layer 383 may be continuously formed on surfaces of the pixel defining layer 382 and the first electrode 381. Alternatively, the organic light emitting layer 383 may be confined by a sidewall of the pixel defining layer 382.

The second electrode 384 may be on the organic light emitting layer 383 and, for example, may include a metal such as lithium (Li), calcium (Ca), lithium fluoride/calcium (LiF/Ca), LiF/Al, Al, Mg, Ag, Cr, W, Mo or Ti and an alloy thereof. In an embodiment, the second electrode 384 may include a transparent conductive material such as ITO, IZO, ZTO, tin oxide or zinc oxide. The second electrode 384 may serve as a cathode of the display device 300.

The second electrode 384 may be continuously formed on substantially an entire surface of the display device 300 to serve as a common electrode. In one embodiment, the second electrode 384 may be patterned in each pixel. In this case, the second electrode 384 may be confined by a sidewall of the pixel defining layer 382 together with the organic light emitting layer 383.

In an embodiment, an electron transport layer (ETL) may be further formed between the second electrode 384 and the organic light emitting layer 383. Additionally, a passivation layer, an upper transparent substrate, etc., may be optionally formed on the second electrode 384.

In accordance with one or more of the aforementioned embodiments, the display device may be included in a computer, a notebook, a mobile phone, a smartphone, a smart pad, a PMP, a PDA, an MP3 player, or another device or system.

By way of summation and review, one or more embodiments may have a contact hole with a sidewall having a stepped portion. This may reduce or minimize a number of photolithography processes for forming the contact hole and/or may reduce or prevent disconnection of one or more conductive layers in the contact hole.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for manufacturing a display substrate, the method comprising:
sequentially stacking a first conductive layer on a base substrate, a first insulation layer on the first conductive layer, a second conductive layer on the first insulation layer, and a second insulation layer on the second conductive layer;
after the first conductive layer, the first insulation layer, the second conductive layer, and the second insulation layer are sequentially stacked, forming a contact hole passing through the first insulation layer, the second conductive layer, and the second insulation layer, a sidewall of the contact hole having a stepped shape; and
forming a third conductive layer connected to the first conductive layer and the second conductive layer through the contact hole on the second insulation layer, wherein forming the contact hole includes:
forming a photoresist layer on the second insulation layer;
removing a portion of the photoresist layer corresponding to a first part of the second insulation layer to form a photoresist pattern;
etching the first part of the second insulation layer;
etching the second conductive layer using the second insulation layer as an etch stopper;
performing an etchback of a portion of the photoresist pattern corresponding to a second part of the second insulation layer;
etching the second part of the second insulation layer; and
etching the first insulation layer.

2. The method as claimed in claim 1, wherein the first part of the second insulation layer is etched using the photoresist pattern as an etch stopper.

3. The method as claimed in claim 1, wherein etching the second part of the second insulation layer includes etching the second insulation layer using the etched photoresist pattern as an etch stopper.

4. The method as claimed in claim 1, wherein etching the second conductive layer and performing the etchback of the portion of the photoresist pattern are simultaneously performed.

5. The method as claimed in claim 1, wherein etching the first insulation layer includes etching the first insulation layer using the second conductive layer as an etch stopper.

6. The method as claimed in claim 1, wherein etching the second part of the second insulation layer and etching the first insulation layer are simultaneously performed.

7. The method as claimed in claim 1, wherein the first insulation layer is spaced apart from the second insulation layer.

* * * * *